(12) United States Patent
Kato et al.

(10) Patent No.: US 7,495,268 B2
(45) Date of Patent: Feb. 24, 2009

(54) SEMICONDUCTOR DEVICE AND MANUFACTURING METHOD OF THE SAME

(75) Inventors: Yoshiaki Kato, Toyama (JP); Yoshiharu Anda, Toyama (JP); Akiyoshi Tamura, Osaka (JP)

(73) Assignee: Panasonic Corporation, Osaka (JP)

( * ) Notice: Subject to any disclaimer, the term of this patent is extended or adjusted under 35 U.S.C. 154(b) by 29 days.

(21) Appl. No.: 11/757,533

(22) Filed: Jun. 4, 2007

(65) Prior Publication Data
US 2007/0295991 A1    Dec. 27, 2007

(30) Foreign Application Priority Data
Jun. 27, 2006    (JP) .............................. 2006-176429

(51) Int. Cl.
*H01L 29/812* (2006.01)
(52) U.S. Cl. .................. 257/192; 257/194; 257/195; 257/E21.403; 257/E29.246
(58) Field of Classification Search .............. 257/192, 257/194, 195, E21.403, E29.246
See application file for complete search history.

(56) References Cited

U.S. PATENT DOCUMENTS
2006/0076585 A1    4/2006    Kato et al.
2006/0273396 A1    12/2006    Anda et al.

FOREIGN PATENT DOCUMENTS
JP    5 121451    5/1993
JP    8 116034    5/1996

OTHER PUBLICATIONS

English language Abstract of JP 8-116034.
English language Abstract of JP 5-121451.
U.S. Appl. No. 11/774,821 to Miyajima et al., which was filed on Jul. 9, 2007.

*Primary Examiner*—Evan Pert
*Assistant Examiner*—Tan N Tran
(74) *Attorney, Agent, or Firm*—Greenblum & Bernstein, P.L.C.

(57) ABSTRACT

A semiconductor device according to the present invention includes: a semiconductor substrate; a channel layer formed on the semiconductor substrate; a donor layer formed on the channel layer; a first Schottky layer formed on the donor layer; a second Schottky layer formed on the first Schottky layer; a first gate electrode formed on the first Schottky layer to form a Schottky barrier junction with the first Schottky layer; a first source electrode and a first drain electrode formed so as to sandwich the first gate electrode and electrically connected to the channel layer; a second gate electrode formed on the second Schottky layer and made of a material different from the first gate electrode to form a Schottky barrier junction with the second Schottky layer; and a second source electrode and a second drain electrode formed so as to sandwich the second gate electrode and electrically connected to the channel layer.

7 Claims, 11 Drawing Sheets

SEMICONDUCTOR DEVICE AND MANUFACTURING METHOD OF THE SAME

BACKGROUND OF THE INVENTION (1) Field of the Invention

The present invention relates to a semiconductor device and a manufacturing method of the same. In particular, the present invention relates to a semiconductor device in which two or more kinds of field-effect transistors having different threshold voltages are integrated on a compound semiconductor substrate, and to a manufacturing method of the same.

(2) Description of the Related Art

Field-effect transistors made of GaAs (hereinafter referred to as GaAsFET) formed on semiconductor substrates have been used as power amplifiers or switches of communication equipment such as mobile telephone terminals due to its high performance. Particularly, monolithic microwave integrated circuits in which active elements such as a GaAsFET and passive elements such as a resistance element and a capacitance element are integrated (hereinafter referred to as GaAsMMIC) have been widely and practically used.

In recent years, higher function and higher performance are required in the GaAsMMIC. In such a situation, it is desired to have a GaAsMMIC incorporating the power amplifier and the switch including a depression-mode FET (hereinafter referred to as D-FET) and a logic circuit including an enhancement-mode FET (hereinafter referred to as E-FET), that is, an E/D-FET in which the E-FET and the D-FET are mounted in a mixed manner on the identical substrate.

As a conventional E/D-FET, a semiconductor device described in Japanese Unexamined Patent Application Publication No. 8-116034 and a semiconductor device described in Japanese Unexamined Patent Application Publication No. 5-121451 have been known, for example.

Hereinafter, such a conventional E/D-FET is described. First, the conventional semiconductor device disclosed in Japanese Unexamined Patent Application Publication No. 8-116034 is described.

Figure 1:
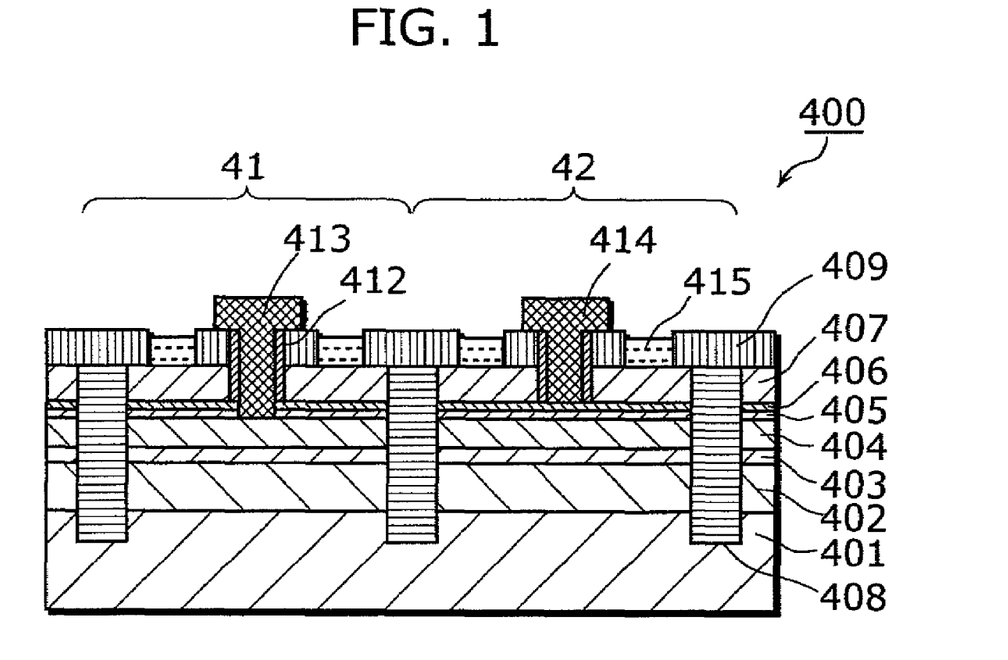
FIG. 1 is a cross sectional view showing a structure of a conventional semiconductor device.

FIG. 1 is a cross-sectional view showing a structure of the semiconductor device described in Japanese Unexamined Patent Application Publication No. 8-116034.

A semiconductor device 400 shown in FIG. 1 includes an E-FET region 41 in which an E-FET is formed and a D-FET region 42 in which a D-FET is formed. The semiconductor device 400 includes a substrate 401 made of a semi-insulating GaAs, a buffer layer 402, a channel layer 403, a donor layer (also referred to as a donor supply layer) 404, a threshold control layer 405, an etching-stopper layer 406, a contact layer 407, an isolation region 408, an insulating film 409, a sidewall protection film 412, gate electrodes 413 and 414, and ohmic electrodes 415.

The buffer layer 402, made of undoped GaAs, is formed on the substrate 401.

The channel layer 403, made of undoped InGaAs, is formed on the buffer layer 402.

The donor layer 404, made of n-type AlGaAs, is formed on the channel layer 403.

The threshold control layer 405, made of n-type AlGaAs, is formed on the donor layer 404.

The etching-stopper layer 406, made of n-type AlGaAs, is formed on the threshold control layer 405.

The contact layer 407, made of n-type GaAs, is formed on the etching-stopper layer 406.

The isolation region 408 is formed by ion implantation, which electrically isolates the E-FET region 41 from the D-FET region 42.

The insulating film 409 is formed on the contact layer 407.

The sidewall protection film 412, made of $SiO_2$, isolates the contact layer 407 from the gate electrode 413 or 414.

The gate electrode 413 contacts the threshold control layer 405 and the etching-stopper layer 406, and forms a Schottky barrier junction with the donor layer 404.

The gate electrode 414 forms a Schottky barrier junction with the etching-stopper layer 406.

The ohmic electrodes 415 are formed in openings formed in the insulating film 409, each of which is electrically connected to the contact layer 407.

Figure 2:
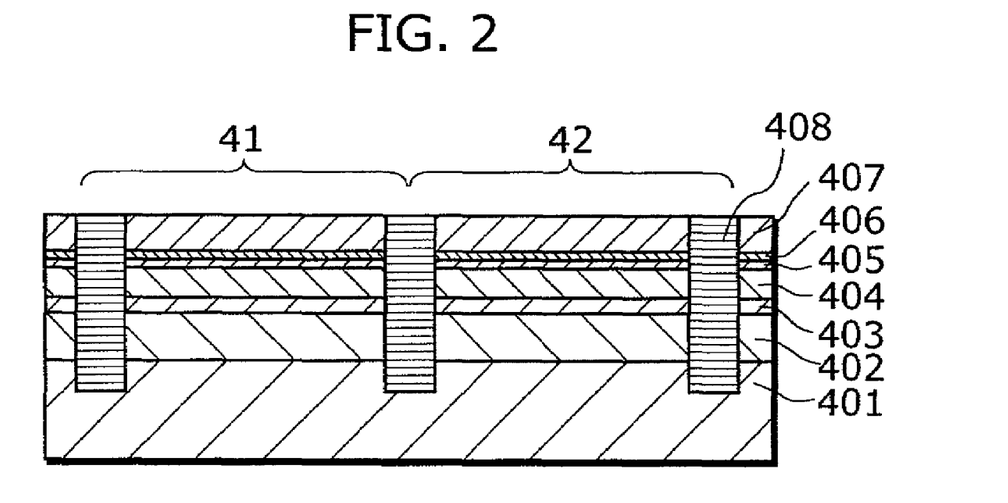
FIG. 2 is a diagram showing a sectional structure in a manufacturing process of the conventional semiconductor device.
Figure 3:
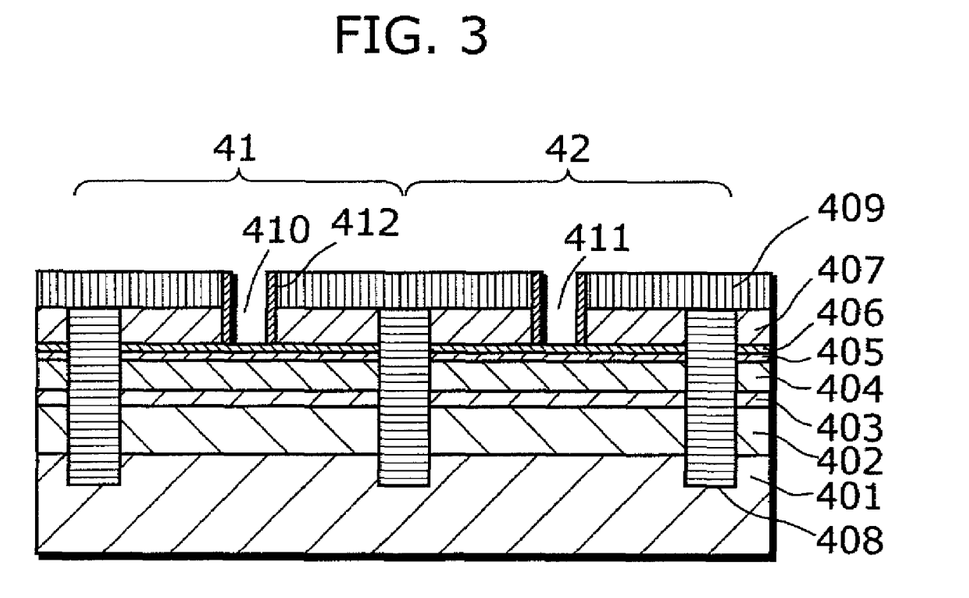
FIG. 3 is a diagram showing a sectional structure in a manufacturing process of the conventional semiconductor device.
Figure 4:
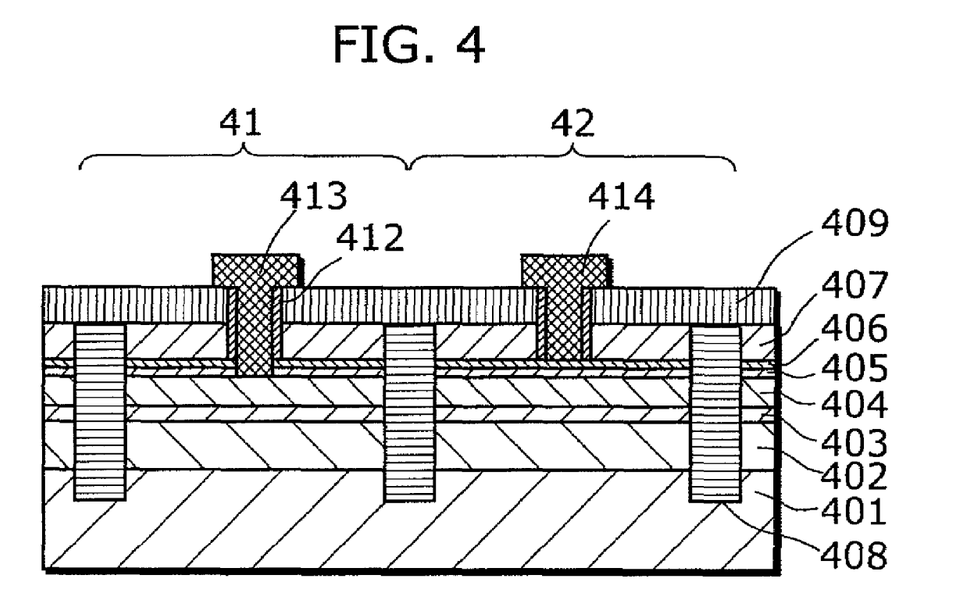
FIG. 4 is a diagram showing a sectional structure in a manufacturing process of the conventional semiconductor device.

Next, a method of manufacturing the conventional semiconductor device 400 is described. FIGS. 2 to 4 are diagrams showing sectional structures in a manufacturing process of the semiconductor device 400.

First, on the substrate 401 made of a semi-insulating GaAs, the GaAs buffer layer 402, the InGaAs channel layer 403, the AlGaAs donor layer 404, the AlGaAs threshold control layer 405, the AlGaAs etching-stopper layer 406 and the GaAs contact layer 407 are epitaxially grown sequentially by using the MOCVD method, the MBE method or the like. The isolation region 408 is formed by implanting boron ions by using a photoresist mask (not illustrated) to thereby form the E-FET region 41 and the D-FET region 42 (FIG. 2).

Next, the insulating film 409 made of $SiO_2$ is formed, and a predetermined region in the insulating film 409 is dry-etched selectively to the contact layer 407 by using a photoresist mask (not illustrated). Further, the GaAs contact layer 407 is dry-etched selectively to the etching-stopper layer 406 to thereby form the gate openings 410 and 411. Further, an insulating film made of $SiO_2$ is formed and then etched back by dry etching, whereby the sidewall protection film 412 is formed (FIG. 3).

Next, the gateway opening 411 is covered with a photoresist mask (not illustrated), and the AlGaAs etching-stopper layer 406 in the gate opening 410 is wet-etched to thereby expose the AlGaAs threshold control layer 405. The AlGaAs threshold control layer 405 is dry-etched selectively to the donor layer 404. Further, the photoresist pattern is removed and WSi and W are laminated, and dry etching is performed on the laminated WSi and W other than a predetermined region by using a photoresist mask (not illustrated) to thereby simultaneously form the E-FET gate electrode 413 and the D-FET gate electrode 414 (FIG. 4).

Next, a predetermined region of the insulating film 409 is opened by using a photoresist mask (not illustrated), and the ohmic electrode 415 made of AuGeNi is formed by the vacuum evaporation and lift-off method. Through the steps described above, the structure of the conventional semiconductor device 400 shown in FIG. 1 is formed.

Next, the conventional semiconductor device disclosed in Japanese Unexamined Patent Application Publication No. 5-121451 is described.

Figure 5:
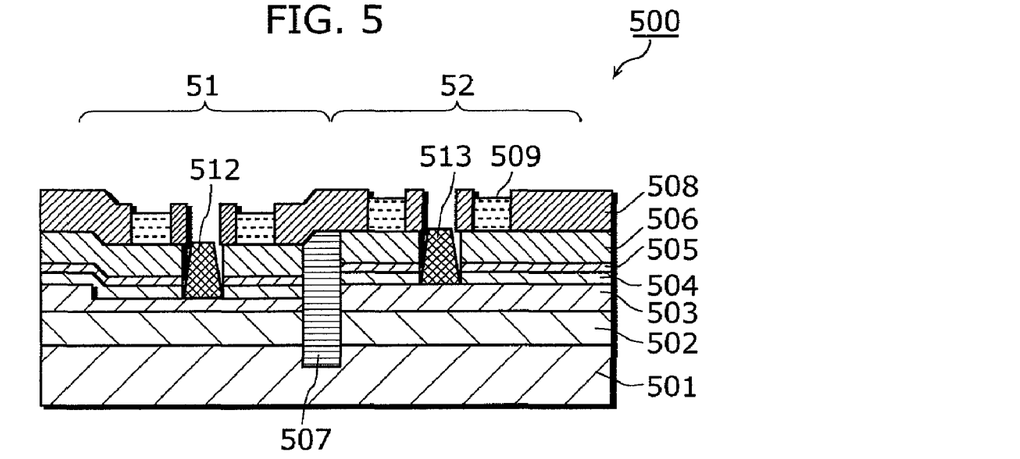
FIG. 5 is a cross sectional view showing the structure of a conventional semiconductor device.

FIG. 5 is a cross-sectional view showing a structure of the semiconductor device described in Japanese Unexamined Patent Application Publication No. 5-121451.

A semiconductor device 500 shown in FIG. 5 includes an E-FET region 51 in which an E-FET is formed, and a D-FET region 52 in which a D-FET is formed. The semiconductor device 500 includes a substrate 501 made of semi-insulating GaAs, a channel layer 502, a donor layer 503, cap layers 504, 505 and 506, an isolation region 507, an insulating film 508, ohmic electrodes 509, and gate electrodes 512 and 513.

The channel layer 502, made of undoped GaAs, is formed on the substrate 501.

The donor layer 503, made of n-type InGaP, is formed on the channel layer 502. The thickness d1 of the donor layer 503 of the E-FET region 51 is formed to be thinner compared with the thickness d2 of the donor layer 503 of the D-FET region 52.

The cap layer 504, made of undoped GaAs, is formed on the donor layer 503.

The cap layer 505, made of n-type InGaP, is formed on the cap layer 504.

The cap layer 506, made of n-type GaAs, is formed on the cap layer 505.

The isolation region 507 is formed by ion implantation, which electrically isolates the E-FET region 51 from the D-FET region 52.

The insulating film 508 is formed on the cap layer 506.

The ohmic electrodes 509 are formed in the openings formed in the insulating film 508, each of which is electrically connected to the cap layer 506.

The gate electrode 512 is formed in the opening formed in the insulating film 508 and the cap layers 504 to 506 of the E-FET region 51, and forms a Schottky barrier junction with the donor layer 503.

The gate electrode 513 is formed in the opening formed in the insulating film 508 and the cap layers 504 to 506 of the D-FET region 52, and forms a Schottky barrier junction with the donor layer 503.

Figure 6:
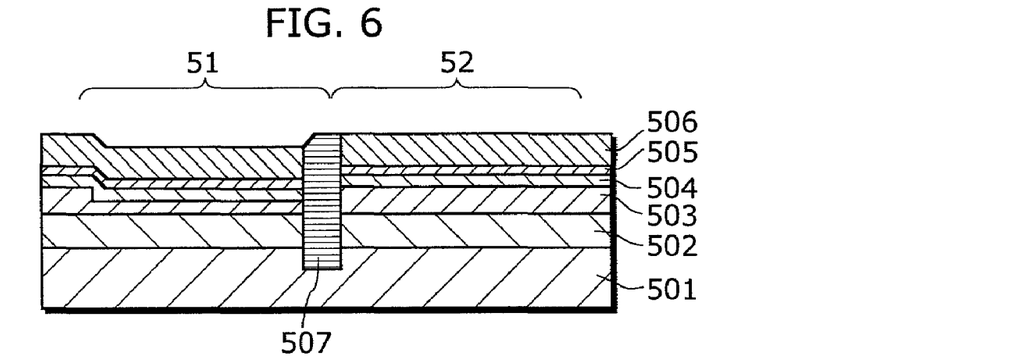
FIG. 6 is a diagram showing a sectional structure in a manufacturing process of the conventional semiconductor device.
Figure 7:
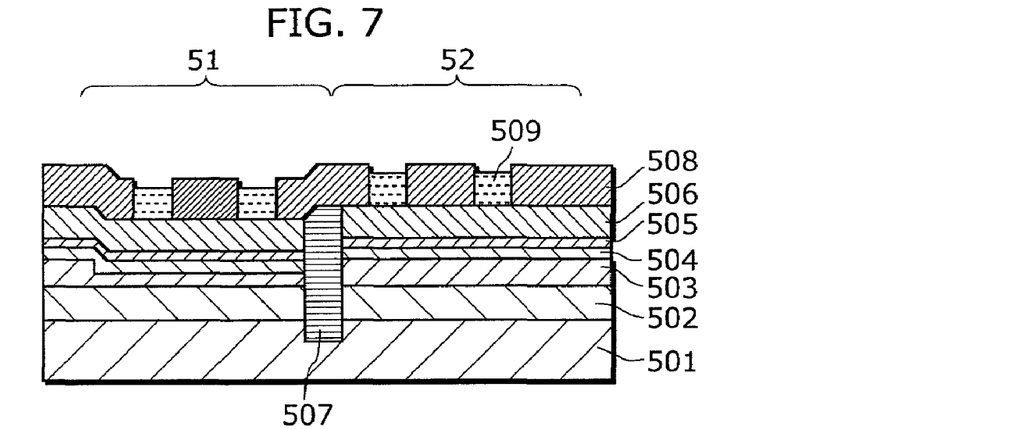
FIG. 7 is a diagram showing a sectional structure in a manufacturing process of the conventional semiconductor device.

Next, a method of manufacturing the semiconductor device 500 is described. FIGS. 6 and 7 are diagrams showing sectional structures in a manufacturing process of the semiconductor device 500.

First, on the substrate 501 made of semi-insulating GaAs, the GaAs channel layer 502 and the InGaP donor layer 503 are formed sequentially by using the MOCVD method or the MBE method. By using a photoresist mask (not illustrated), the thickness of a part in a predetermined region of the InGaP donor layer 503 is wet-etched. After removing the photoresist mask, the GaAs cap layer 504, the InGaP cap layer 505 and the GaAs cap layer 506 are further formed sequentially. Further, the isolation region 507 is formed by implanting $O_2$ ions by using a photoresist mask (not illustrated) to thereby form the E-FET region 51 and the D-FET region 52 (FIG. 6).

Next, the insulating film 508 made of $SiO_2$ is formed, and a predetermined region is wet-etched selectively to the GaAs cap layer 506 by using a photoresist mask (not illustrated). Further, the ohmic electrodes 509 made of AuGe/Au, making an ohmic contact with the GaAs cap layer 506, are formed by the vacuum evaporation and lift-off method (FIG. 7).

Next, a predetermined region of the insulating film 508 is wet-etched selectively to the GaAs cap layer 506 by using a photoresist mask (not illustrated) to thereby form gate openings for forming the gate electrodes 512 and 513. The GaAs cap layer 506 in the gate opening is wet-etched selectively to the InGaP cap layer 505 to thereby expose the InGaP cap layer 505. Next, the InGaP cap layer 505 is wet-etched selectively to the GaAs cap layer 504 to thereby expose the GaAs cap layer 504. Next, the GaAs cap layer 504 is dry-etched selectively to the InGaP donor layer 503 to thereby expose the InGaP donor layer 503. Further, the E-FET gate electrode 512 and the D-FET gate electrode 513 are formed by means of the vacuum evaporation and lift-off method using Ti/Pt/Au material. Through the steps described above, the structure of the semiconductor device 500 shown in FIG. 5 is formed.

SUMMARY OF THE INVENTION

However, in a semiconductor device in which E/D-FET are mounted in a mixed manner on an identical substrate, the E-FET and the D-FET are used for different purposes, so required characteristics and accuracy are also different. As an element for determining the characteristics of an FET, a gate electrode material is important. Further, it is necessary to select a combination of a gate electrode material and a material of a semiconductor layer with which the gate electrode forms a Schottky barrier junction. In the semiconductor device 400 described in Japanese Unexamined Patent Application Publication No. 8-116034, as the gate electrodes of E-FET and D-FET, the gate electrodes 414 and 415 both of which are made of WSi/W are formed. With such a structure, the gate resistance increases, whereby the characteristics of the D-FET constituting a switch can not be sufficiently obtained particularly. Further, in the semiconductor device 500 described in Japanese Unexamined Patent Application Publication No. 5-121451, as the gate electrodes of the E-FET and the D-FET, the gate electrodes 512 and 513 both of which are made of Ti/Pt/Au are used. Further, as a semiconductor layer which forms a Schottky barrier junction with the gate electrodes 512 and 513, the InGaP donor layer 503 is used. Since Ti/Pt/Au is used for the gate electrodes, an increase in the gate resistance of the D-FET can be reduced. However, each of the gate electrodes 512 and 513 forms a Schottky barrier junction with InGaP. With this structure, InGaP and Ti may react due to an effect of a process temperature, whereby the threshold voltage may fluctuate. In particular, in the E-FET, the controllability and the stability of the threshold voltage are important. If the threshold voltage fluctuates, the required characteristics can not be achieved, causing the yield to drop. That is, a conventional semiconductor device, in which E/D-FET are mounted in a mixed manner, can not be realized while achieving the characteristics required for both of the E-FET and the D-FET.

In view of the above, the present invention has been developed to solve the problems described above. It is therefore an object of the present invention to provide a semiconductor device and a manufacturing method of the same, capable of realizing the characteristics required for both of an E-FET and a D-FET.

In order to achieve the aforementioned object, the semiconductor device according to the present invention: a semiconductor substrate; a channel layer formed on the semiconductor substrate; a donor layer formed on the channel layer; a first Schottky layer formed on the donor layer; a second Schottky layer formed on the first Schottky layer; a first gate electrode formed on the first Schottky layer, the first gate electrode forming a Schottky barrier junction with the first Schottky layer; a first source electrode and a first drain electrode which are formed so as to sandwich the first gate electrode, and are electrically connected to the channel layer; a second gate electrode which is formed on the second Schottky layer, forming a Schottky barrier junction with the second Schottky layer, and made of a material different from the first gate electrode; and a second source electrode and a second drain electrode which are formed so as to sandwich the second gate electrode, and are electrically connected to the channel layer.

According to this structure, in the semiconductor device according to the present invention, the first gate electrode which is a gate electrode of the E-FET and the second gate electrode which is a gate electrode of the D-FET are made of different materials. Thereby, by using a material having less reactivity to the first Schottky layer caused by an effect such as a process temperature, as the material constituting the gate electrode of the E-FET, it is possible to improve the controllability and the stability of a threshold voltage required for the E-FET. Further, by using a material having low resistance as the material constituting the gate electrode of the D-FET, it is possible to reduce the gate resistance of the D-FET and to improve the characteristics. Thereby, the semiconductor device according to the present invention can realize the characteristics required for both of the E-FET and the D-FET.

Furthermore, it is possible that the semiconductor device includes a third electrode which is formed on the first gate electrode, and made of a material same as the second gate electrode.

According to this structure, even in the case of using a material having less reactivity caused due to an effect of a process temperature with the first Schottky layer and having a high resistance value, as the material constituting the gate electrode of the E-FET, the third electrode made of a material of low resistance can be laminated on the first gate electrode. In other words, it is possible to reduce an increase in gate resistance caused when the stability of a threshold voltage of the E-FET is improved. Further, the third gate electrode is simultaneously made of the identical material as the gate electrode of the D-FET. Therefore, in the case where the gate electrode of the E-FET has a two-layer structure, an increase in the process steps can be reduced. Namely, an increase in the process cost can be reduced.

Furthermore, it is possible that the first source electrode, the second source electrode, the first drain electrode, and the second drain electrode are made of a material same as the second gate electrode.

According to this structure, the source electrodes and the drain electrodes of the E-FET and the D-FET are simultaneously formed of the identical material as the gate electrode of the D-FET. Thereby, the process steps can be reduced. This enables to reduce the process cost.

Furthermore, it is possible that the first gate electrode is made of one of W, WSi and WSiN.

According to this structure, the first gate electrode is made of a material constituting the first Schottky layer (e.g., InGaP) and W, WSi, WSiN or the like which has less reactivity caused due to an effect of a process temperature or the like. Thereby, the controllability and the stability of a threshold voltage of the E-FET can be improved.

Furthermore, it is possible that the first Schottky layer is formed in at least a single layer, and a top layer thereof is made of InGaP.

According to this structure, the first Schottky layer is made of the material of the first gate electrode (e.g., WSiN) and InGaP having less reactivity caused due to an effect of a process temperature or the like. Thereby, the controllability and the stability of a threshold value of the E-FET can be improved.

Furthermore, it is possible that the second Schottky layer is formed in at least a single layer, and a bottom layer thereof is made of one of AlGaAs and GaAs. Furthermore, it is possible that the semiconductor substrate is made of one of GaAs and InP.

Furthermore, the manufacturing method of a semiconductor device according to the present invention is a manufacturing method of a semiconductor device including an enhancement-mode field-effect transistor and a depression-mode field-effect transistor, and includes: forming a channel layer on a semiconductor substrate; forming a donor layer on the channel layer; forming a first Schottky layer on the donor layer; forming a second Schottky layer on the first Schottky layer; forming a first opening for exposing the first Schottky layer, in the second Schottky layer; forming a first electrode in the first opening, the first electrode being a gate electrode of the enhancement-mode field-effect transistor and forming a Schottky barrier junction with the first Schottky layer; and forming a second electrode on the second Schottky layer, the second electrode forming a Schottky barrier junction with the second Schottky layer, being a gate electrode of the depression-mode field-effect transistor, and being made of a material different from the first gate electrode.

According to this structure, the first gate electrode which is the gate electrode of the E-FET and the second gate electrode which is the gate electrode of the D-FET are made of different materials. Thereby, by using a material having less reactivity to the first Schottky layer caused due to an effect such as a process temperature, as the material constituting the gate electrode of the E-FET, it is possible to improve the controllability and the stability of a threshold voltage required for the E-FET. Further, by using a material of low resistance as the material constituting the gate electrode of the D-FET, it is possible to reduce the gate resistance of the D-FET and to improve the characteristics. Thereby, the semiconductor device formed by the manufacturing method according to the present invention can realize the characteristics required for both of the E-FET and the D-FET.

Furthermore, in the forming of the second electrode, it is possible that the second gate electrode and a third gate electrode formed on the first gate electrode are formed simultaneously and made of an identical material.

According to this structure, even in the case of using a material having less reactivity caused due to an effect of a process temperature with the first Schottky layer and having a high resistance value, as the material constituting the gate electrode of the E-FET, the third electrode made of a material of low resistance can be laminated on the first gate electrode, whereby the total resistance value of the gate electrode can be reduced. In other words, it is possible to reduce an increase in gate resistance caused when the stability of a threshold voltage of the E-FET is improved. Further, the third gate electrode is simultaneously made of the identical material as the gate electrode of the D-FET. Therefore, an increase in the process steps in the case where the gate electrode of the E-FET has a two-layer structure can be reduced. Namely, an increase in the process cost can be reduced.

Furthermore, it is possible that in the forming of the second electrode, the second electrode, a first source electrode and a first drain electrode, and a second source electrode and a second drain electrode are simultaneously formed and made of an identical material, the first source electrode and the first drain electrode being formed so as to sandwich the first gate electrode and being electrically connected to the channel layer, and the second source electrode and the second drain electrode being formed so as to sandwich the second gate electrode and being electrically connected to the channel layer.

According to this structure, the source electrodes and the drain electrodes of the E-FET and the D-FET are simultaneously formed of the identical material as the gate electrode of the D-FET. Thereby, the process steps can be reduced. This enables to reduce the process cost.

The present invention is capable of providing a semiconductor device and a manufacturing method of the same in which the characteristics required for both of the E-FET and the D-FET can be realized.

Further Information about Technical Background to this Application

The disclosure of Japanese Patent Application No. 2006-176429 filed on Jun. 27, 2006 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT

Hereinafter, a semiconductor device according to an embodiment of the present invention is described with reference to the drawings.

In a semiconductor device according to the embodiment of the present invention, a gate electrode of an E-FET and a gate electrode of a D-FET are made of different materials. This enables to improve the characteristics of the E-FET and the D-FET.

First, a structure of the semiconductor device according to the embodiment of the present invention is described.

Figure 8:
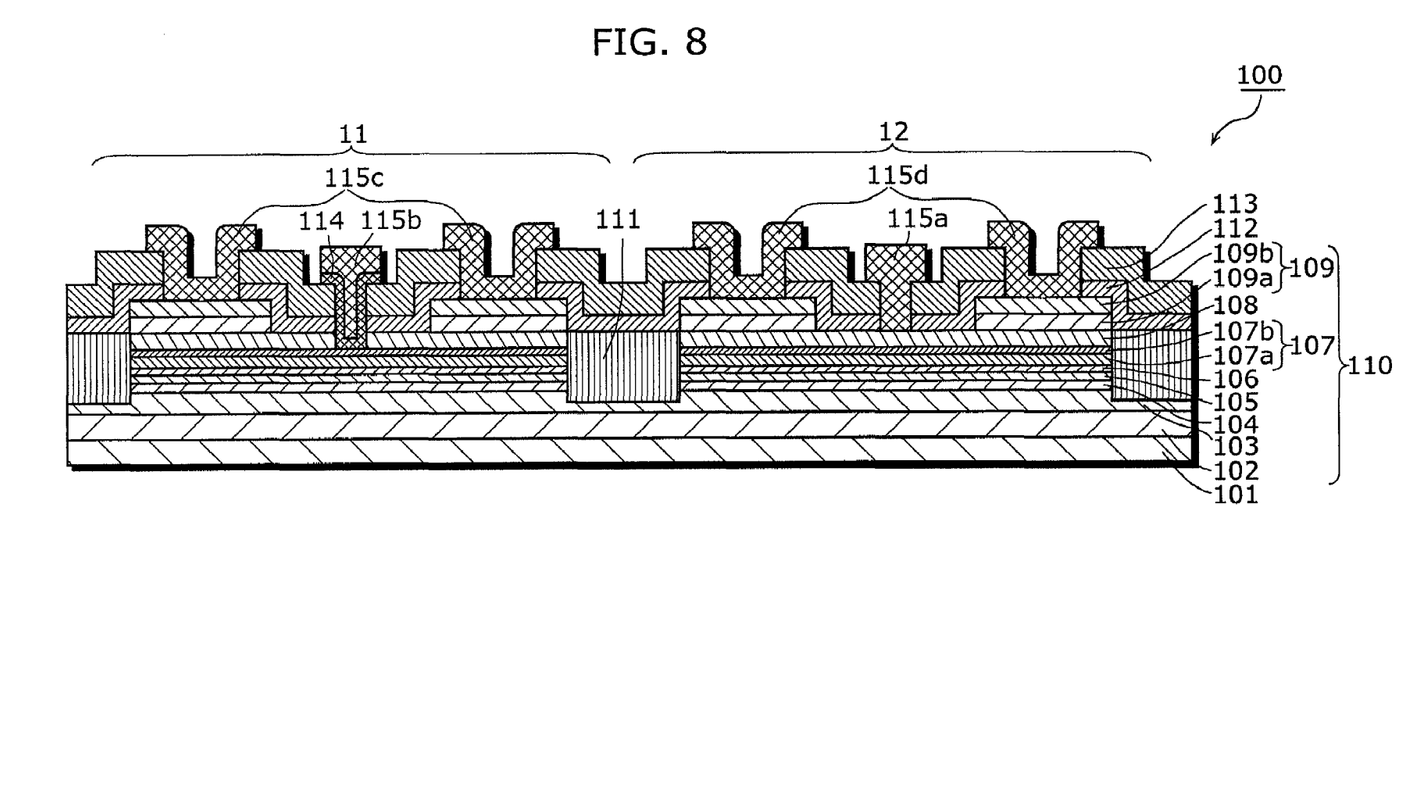
FIG. 8 is a cross sectional view showing a structure of a semiconductor device according to an embodiment of the present invention.
Figure 9:
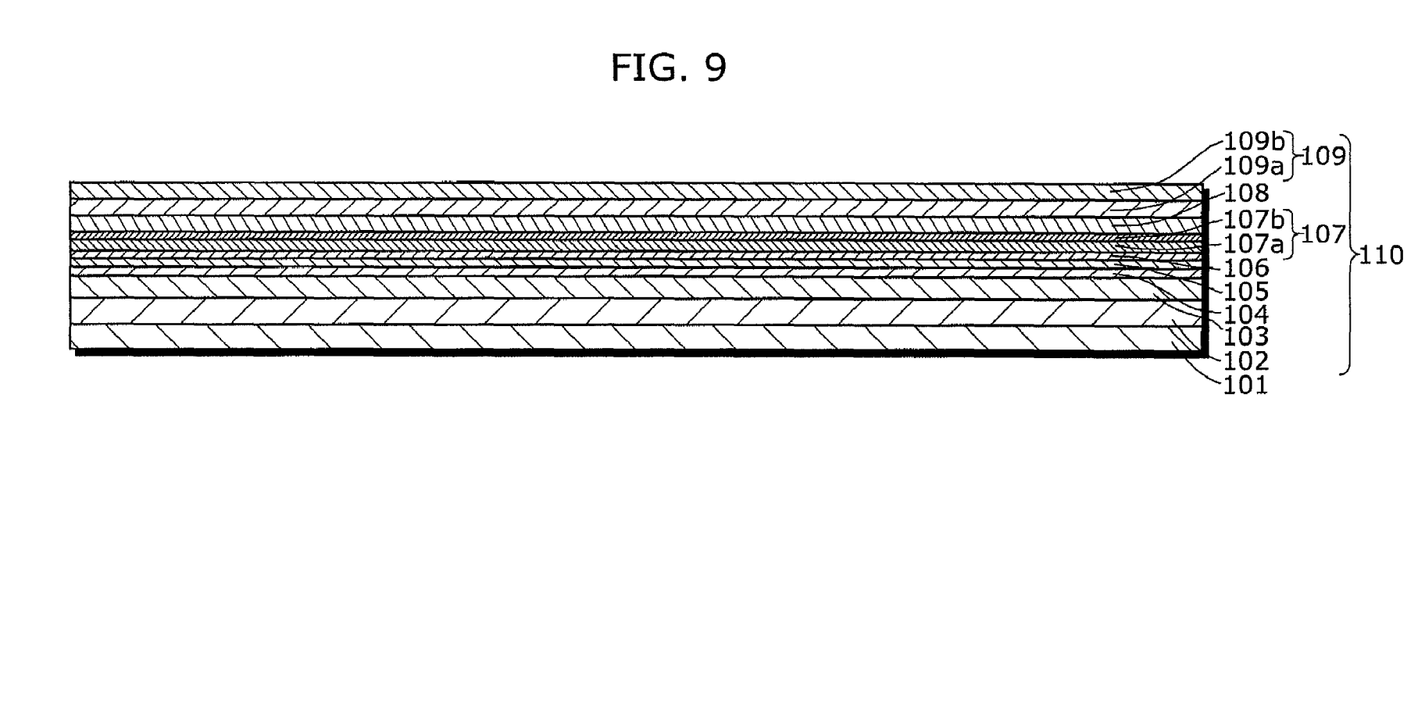
FIG. 9 is a diagram showing a sectional structure in a manufacturing process of the semiconductor device according to the embodiment of the present invention.
Figure 10:
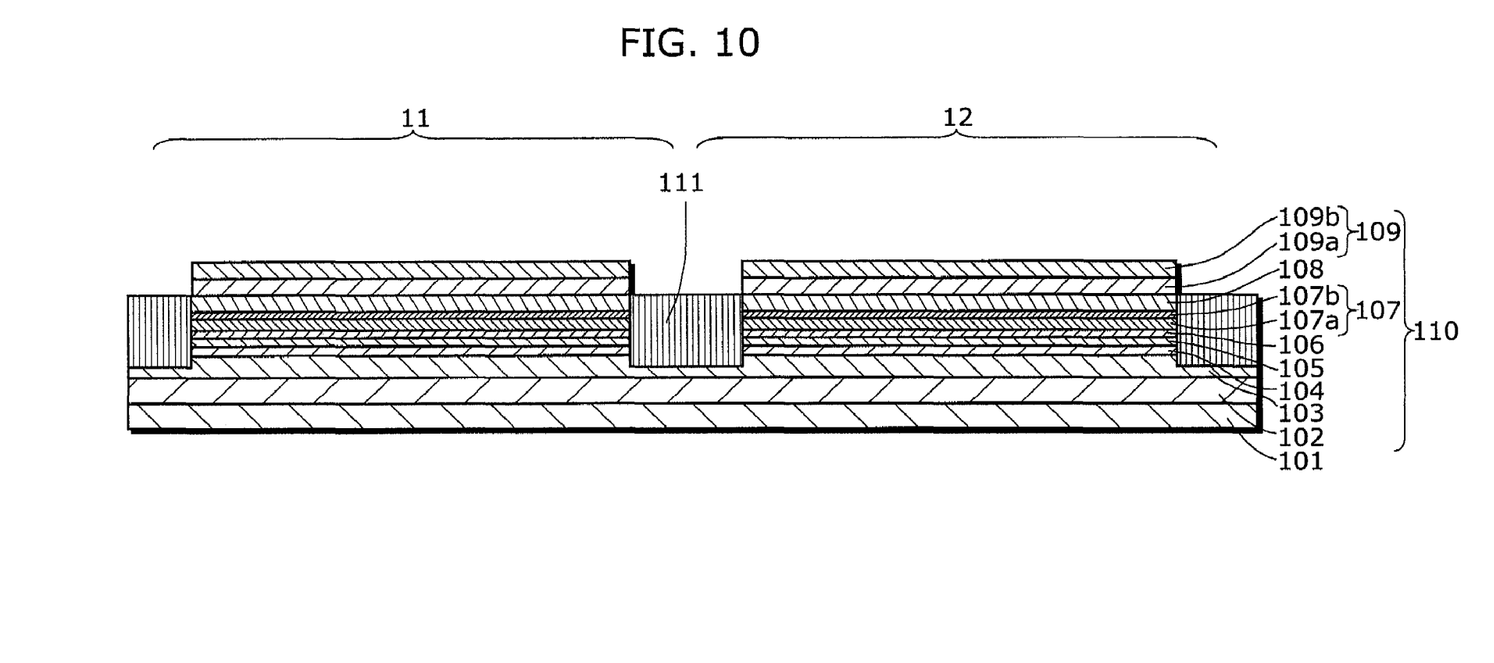
FIG. 10 is a diagram showing a sectional structure in a manufacturing process of the semiconductor device according to the embodiment of the present invention.
Figure 11:
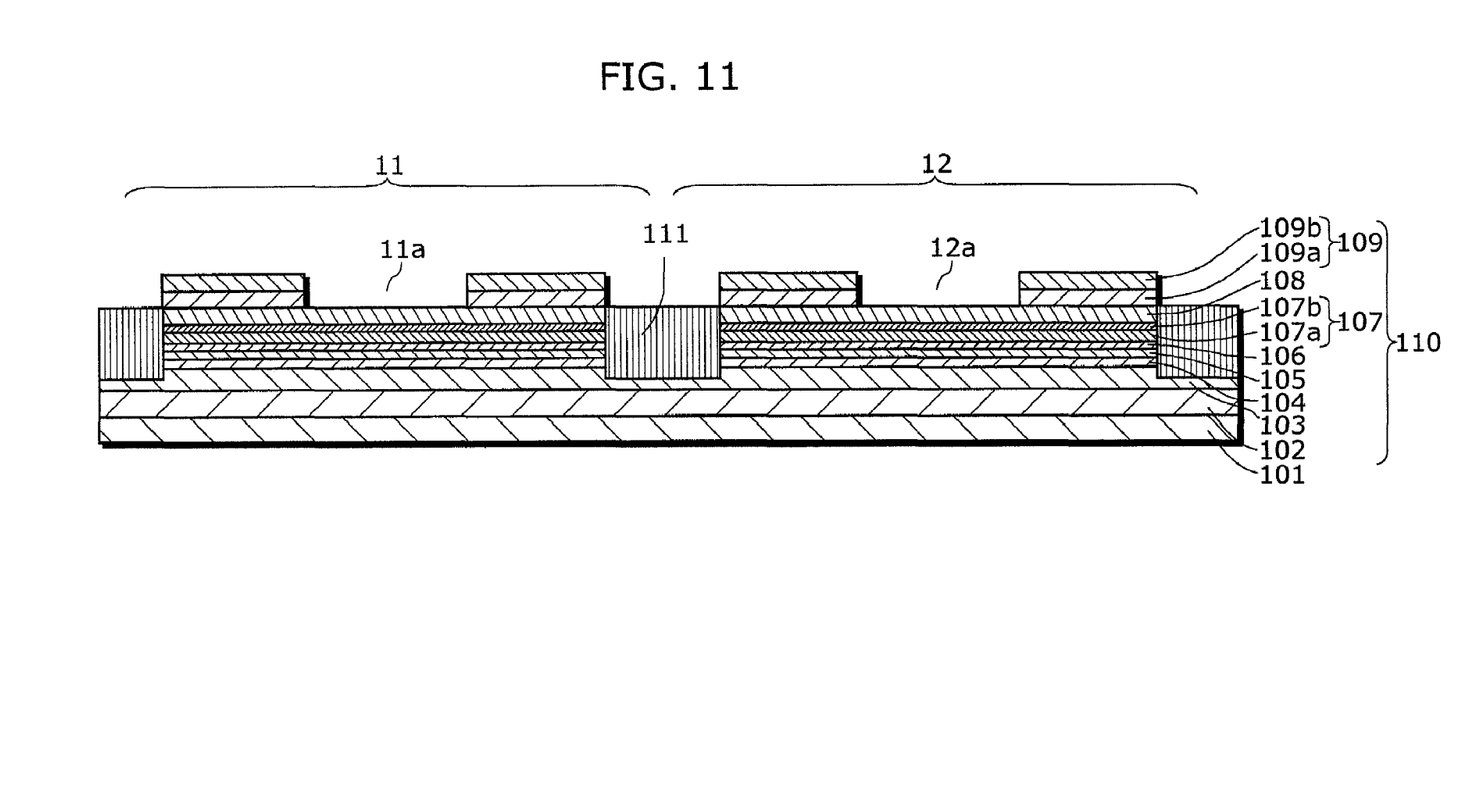
FIG. 11 is a diagram showing a sectional structure in a manufacturing process of the semiconductor device according to the embodiment of the present invention.

FIG. 8 is a cross sectional view showing the structure of the semiconductor device according to the embodiment of the present invention.

A semiconductor device 100 shown in FIG. 8 includes an E-FET region 11 in which an E-FET is formed, and a D-FET region 12 in which a D-FET is formed. The semiconductor device 100 includes a substrate 101 which is a semiconductor substrate made of semi-insulating GaAs, an epitaxial layer 110, an isolation region 111, insulating films 112 and 113, gate electrodes 114, 115a and 115b, and ohmic electrodes 115c and 115d.

The epitaxial layer 110 is formed by crystal-growing a semiconductor layer on the substrate 101. The epitaxial layer 110 includes buffer layers 102 and 103, a channel layer 104, a spacer layer 105, a donor layer 106, Schottky layers 107 and 108, and a contact layer 109.

The buffer layer 102 is formed on the substrate 101. The buffer layer 102 is made of undoped GaAs with a thickness of 1 μm for example. The buffer layer 103, made of undoped AlGaAs, is formed on the buffer layer 102. The buffer layers 102 and 103 relax the lattice mismatching between the epitaxial layer 110 and the substrate 101.

The channel layer 104, made of undoped In0.2Ga0.8As with a thickness of 10 nm, is formed on the buffer layer 103. The channel layer 104 is a layer in which carriers travel.

The spacer layer 105, made of undoped AlGaAs with a thickness of 5 nm, is formed on the channel layer 104.

The donor layer 106 is made of AlGaAs with a thickness of 10 nm in which Si that is an n-type impurity ion is doped, and is formed on the spacer layer 105.

The Schottky layer 107 is formed on the donor layer 106. The Schottky layer 107 includes two layers, that is, a threshold control layer 107a and an etching-stopper layer 107b. The threshold control layer 107a, made of undoped AlGaAs with a thickness of 10 nm, is formed on the donor layer 106. The etching-stopper layer 107b, made of InGaP with a thickness of 5 nm, is formed on the threshold control layer 107a.

The Schottky layer 108, made of undoped AlGaAs with a thickness of 10 nm, is formed on the Schottky layer 107. The Schottky layer 108 also serves as a threshold control layer.

The contact layer 109 is formed on the Schottky layer 108. The contact layer 109 is divided into four regions, to each of which the ohmic electrode 115c or 115d is connected. The contact layer 109 includes a contact layer 109a and a contact layer 109b. The contact layer 109a, made of n-type GaAs with a thickness of 50 nm, is formed on the Schottky layer 108. The contact layer 109b, made of n-type In GaAs with a thickness of 50 nm, is formed on the contact layer 109a.

The isolation region 111 is formed by ion implantation, which electrically separates the E-FET region 11 and the D-FET region 12.

The insulating film 112, made of SiN for example, is formed on the epitaxial layer 110 and the isolation region 111. The insulating film 113, made of $SiO_2$ for example, is formed on the insulating film 112.

The gate electrode 114 is formed so as to be embedded in the opening formed in the insulating films 112 and 113 and the Schottky layer 108 of the transistor region 11. The gate electrode 114 is made of WSiN for example. The gate electrode 114 corresponds to the gate part of the E-FET, and forms a Schottky barrier junction with the etching-stopper layer 107b of the Schottky layer 107.

The gate electrode 115a is formed so as to be embedded in the opening formed in the insulating films 112 and 113 of the transistor region 12. The gate electrode 115a is made of Ti/Al/Ti for example. The gate electrode 115a corresponds to the gate part of the D-FET, and forms a Schottky barrier junction with the Schottky layer 108.

The gate electrode 115b is formed on the gate electrode 114. The gate electrode 115b is made of a material different from that of the gate electrode 114. Further, the gate electrode 115b is simultaneously formed of the identical material as that of the gate electrode 115a. For example, the gate electrode 115b is made of Ti/Al/Ti.

The ohmic electrodes 115c are a source electrode and a drain electrode of the E-FET, respectively, and are formed so as to sandwich the gate electrode 114. Each of the ohmic electrodes 115c is electrically connected to the channel layer 104 via the contact layer 109, the Schottky layers 107 and 108, the donor layer 106 and the spacer layer 105. Each of the ohmic electrodes 115c is formed so as to be embedded in the opening formed in the insulating films 112 and 113 of the transistor region 11. The ohmic electrode 115c makes an ohmic contact with the contact layer 109 of the ohmic parts (drain part and source part) of the E-FET formed in the transistor region 11.

The ohmic electrodes 115d are a source electrode and a drain electrode of the D-FET, respectively, and are formed so as to sandwich the gate electrode 115a. Each of the ohmic electrodes 115d is electrically connected to the channel layer 104 via the contact layer 109, the Schottky layers 107 and 108, the donor layer 106 and the spacer layer 105. Each of the ohmic electrodes 115d is formed so as to be embedded in the opening formed in the insulating films 112 and 113 of the transistor region 12. The ohmic electrode 115d makes an ohmic contact with the contact layer 109 of the ohmic parts (drain part and source part) of the D-FET formed in the transistor region 12. Further, the ohmic electrodes 115c and 115d are simultaneously made of the identical material as that of the gate electrodes 115a and 115b. The ohmic electrodes 115c and 115d are made of Ti/Al/Ti for example.

Next, a method of manufacturing the semiconductor device 100 shown in FIG. 8 is described.

FIGS. 9 to 15 are diagrams showing sectional structures in the manufacturing process of the semiconductor device 100.

First, the GaAs buffer layer 102, the AlGaAs buffer layer 103, the InGaAs channel layer 104, the AlGaAs spacer layer 105, the AlGaAs donor layer 106, the AlGaAs threshold control layer 107a, the InGaP etching-stopper layer 107b, the AlGaAs Schottky layer 108, the GaAs contact layer 109a and the InGaAs contact layer 109b are epitaxially grown sequentially on the substrate 101 made of a semi-insulating GaAs by using the MOCVD method or the MBE method. The entire area from the buffer layer 102 to the contact layer 109 each of which has been epitaxially grown is referred to as an epitaxial layer 110. Further, the threshold control layer 107a and the etching-stopper layer 107b are collectively referred to as a Schottky layer 107. Further, the contact layers 109a and 109b are collectively referred to as a contact layer 109. Through the steps described above, the structure shown in FIG. 9 is formed.

Next, the contact layer 109 other than a predetermined region is removed using a photoresist mask (not illustrated) to thereby form the E-FET region 11 and the D-FET region 12. Further, in order to electrically isolate the E-FET region 11 from the D-FET region 12, an isolation region 111 is formed by implanting boron ions for example. Through the steps described above, the structure shown in FIG. 10 is formed.

Next, the contact layer 109 other than a predetermined region is removed in the E-FET region 11 and the D-FET region 12 by using a photoresist mask (not illustrated) to thereby form the ohmic contact region 11a in the E-FET region 11 and the ohmic contact region 12a of the D-FET region 12. For example, the contact layer 109 is removed by dry etching using a mixed gas of $SiCl_4/SF_6/N_2$ for example. Through the steps described above, the structure shown in FIG. 11 is formed.

Figure 12:
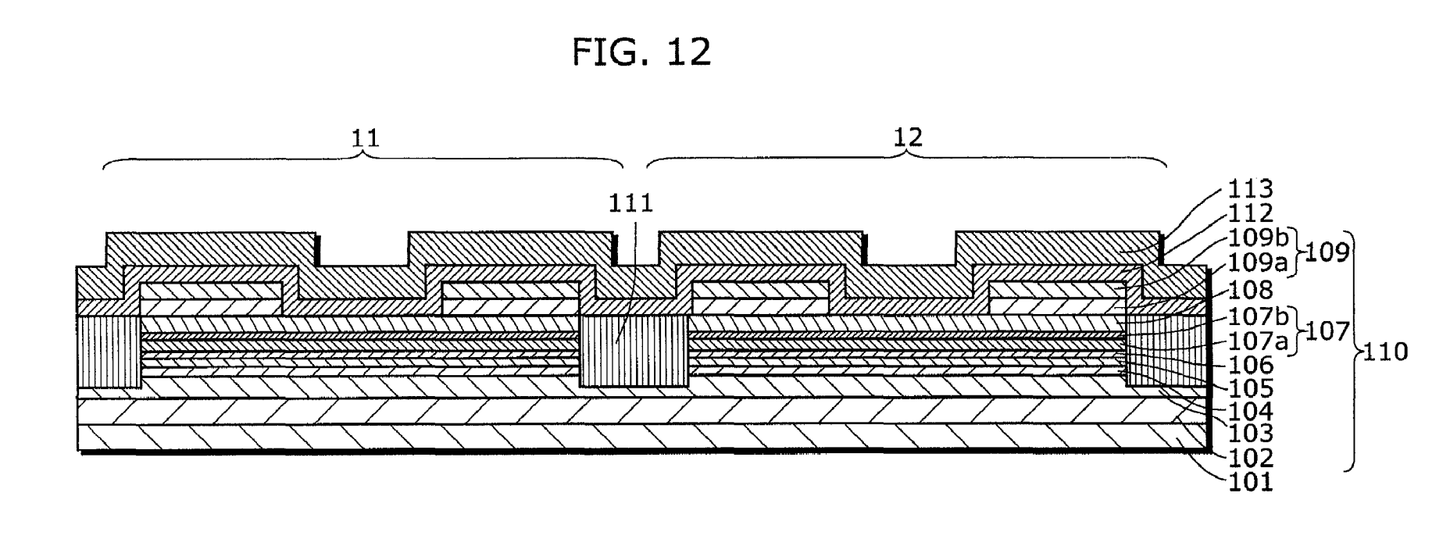
FIG. 12 is a diagram showing a sectional structure in a manufacturing process of the semiconductor device according to the embodiment of the present invention.
Figure 13:
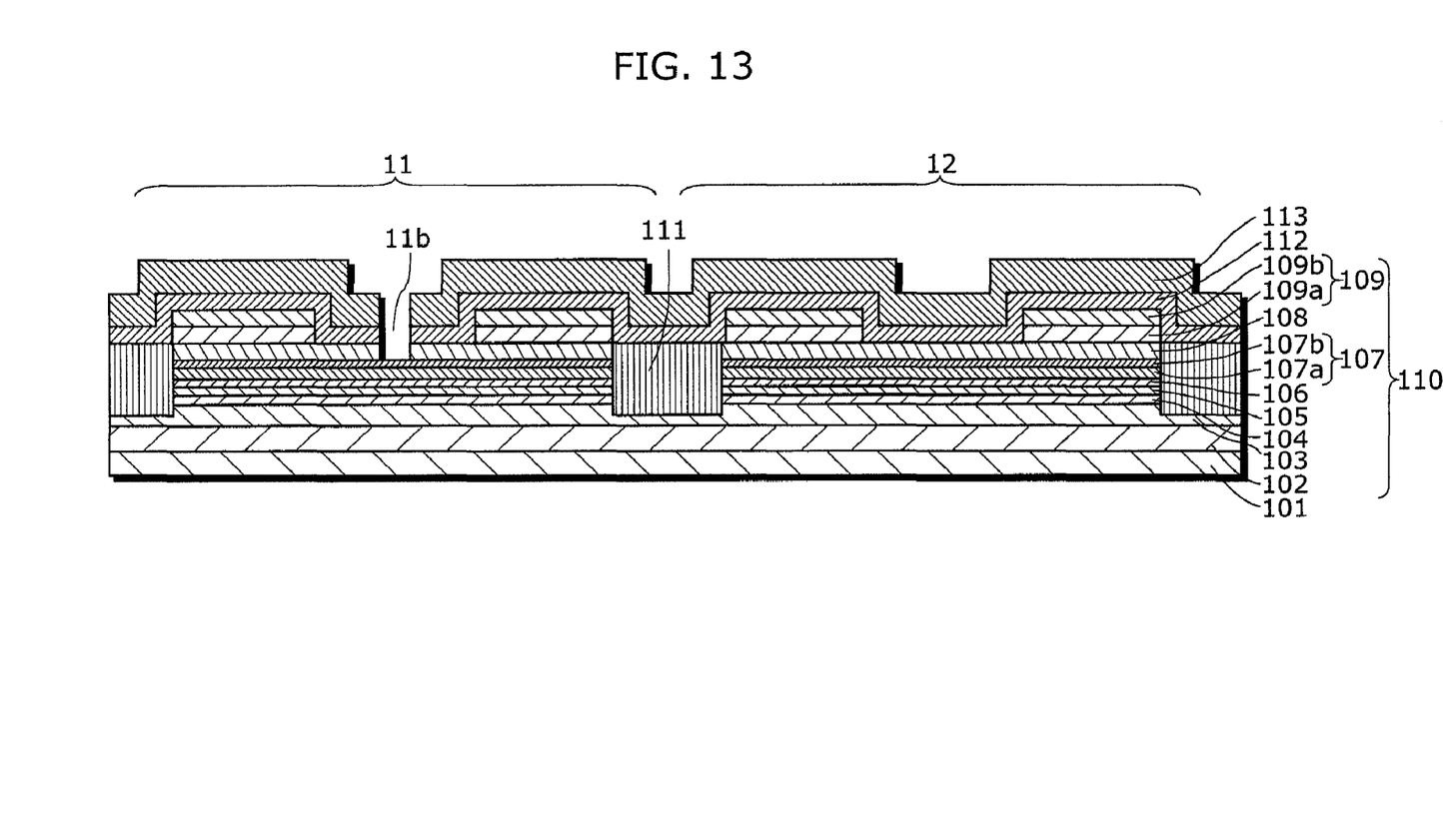
FIG. 13 is a diagram showing a sectional structure in a manufacturing process of the semiconductor device according to the embodiment of the present invention.
Figure 14:
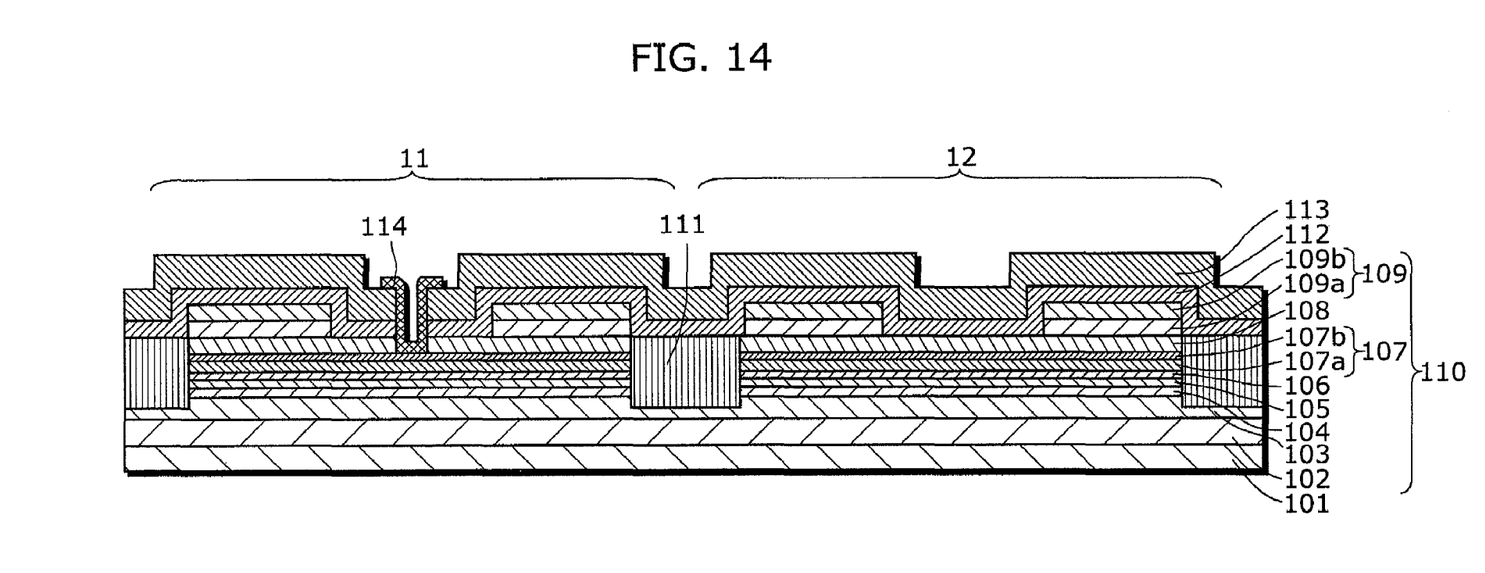
FIG. 14 is a diagram showing a sectional structure in a manufacturing process of the semiconductor device according to the embodiment of the present invention.
Figure 15:
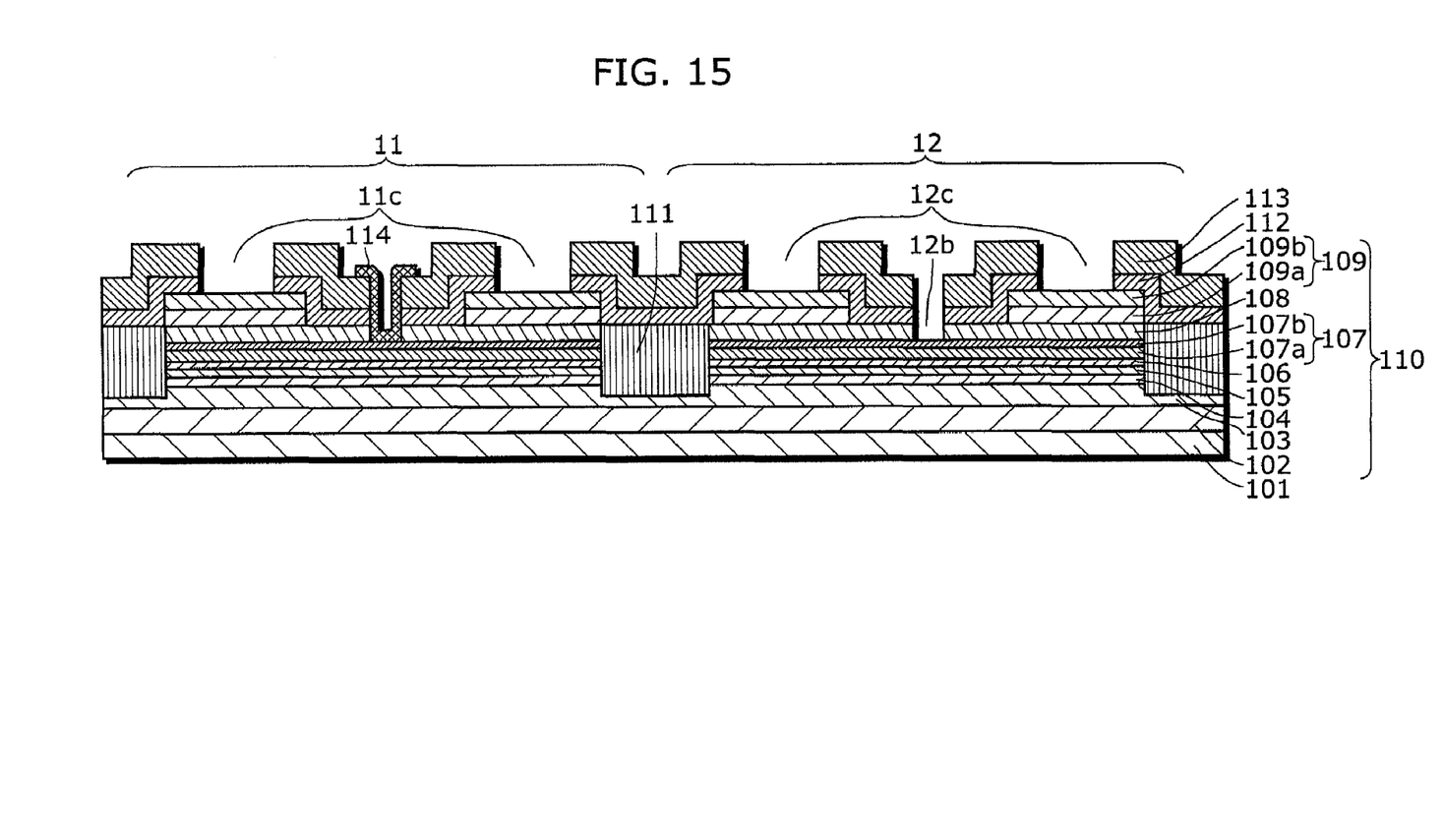
FIG. 15 is a diagram showing a sectional structure in a manufacturing process of the semiconductor device according to the embodiment of the present invention.

Next, the insulating film 112 made of SiN and the insulating film 113 made of $SiO_2$ are formed. Through the step, the structure shown in FIG. 12 is formed.

Next, predetermined regions respectively in the insulating films 112 and 113 within the E-FET region 11 are dry-etched selectively to the AlGaAs threshold control layer 108, by using a photoresist mask (not illustrated). For example, dry etching using a mixed gas of $CHF_3/SF_6$ is performed. Next, the AlGaAs threshold control layer 108 is selectively wet-etched to the InGaP etching-stopper layer 107b formed underneath thereof, by using a mixed liquid of phosphoric acid, hydrogen peroxide solution and water. Thereby, the gate opening 11b for exposing the Schottky layer 107 of the E-FET region 11 is formed. Through the steps described above, the structure shown in FIG. 13 is formed.

Next, WSiN, for example, is sputtered all over the surface and dry etching is performed on the WSiN other than a predetermined region by using a photoresist mask (not illustrated) to thereby form the gate electrode 114. For example, dry etching using a mixed gas of $Cl_2/O_2$ is performed. Through the steps described above, the structure shown in FIG. 14 is formed.

Next, predetermined regions respectively in the insulating films 112 and 113 within the E-FET region 11 and the D-FET region 12 are dry-etched selectively to the AlGaAs threshold control layer 108 and the InGaAs contact layer 109b which are formed underneath thereof, by using a photoresist mask (not illustrated). For example, dry etching using a mixed gas of $CHF_3/SF_6$ is performed. Thereby, the ohmic opening 11c of the E-FET region 11, the gate opening 12b of the D-FET region 12, and the ohmic opening 12c of the D-FET region 12 are formed. Through the steps described above, the structure shown in FIG. 15 is formed.

Next, Ti/Al/Ti, for example, is evaporated all over the surface, and dry etching is performed by using a photoresist mask (not illustrated) to thereby form the gate electrode 115b laminated on the gate electrode 114 in the E-FET region 11, the ohmic electrodes 115c formed in the E-FET region 11, and the gate electrode 115a of the D-FET region 12, and the ohmic electrodes 115d in the D-FET region 12. For example, dry etching using a mixed gas of $Cl_2/BCl_3$ is performed. Through the steps described above, the structure of the semiconductor device 100 shown in FIG. 8 is formed.

Through the steps described above, in the semiconductor device 100 according to the present embodiment, the gate electrodes of the E-FET and the D-FET are made of different electrode materials. Thereby, it is possible to satisfy the characteristics required for the E-FET and the D-FET, respectively. Specifically, the gate electrode of the D-FET is made of an electrode material having low resistance such as Ti/Al/Ti, whereby the gate resistance of the D-FET can be reduced, enabling to improve the characteristics of the D-FET. If Ti/Al/Ti is also used as the electrode material of the gate electrode of the E-FET, InGaP constituting the etching-stopper layer 107b and Ti constituting the gate electrode may react due to an effect of a process temperature so as to cause the threshold voltage of the E-FET to fluctuate. Particularly, for the E-FET, controllability and stability of the threshold voltage are important. If the threshold voltage fluctuates, the required characteristics may not be obtained, causing the yield to drop. On the other hand, in the semiconductor device 100 according to the present embodiment, an electrode material which is less reactive to InGaP, such as WSiN, is used for the gate electrode 114. Thereby, the controllability and stability of the threshold voltage of the E-FET can be improved. Therefore, the yield of the semiconductor device 100 can be improved.

Further, in the semiconductor device 100 according to the present invention, the gate electrode 115b is laminated on the gate electrode 114 of the E-FET. Thereby, even in the case where WSiN or the like having higher resistance value than Ti/Al/Ti or the like, which is the electrode material of the gate electrode 115a and the like of the D-FET, is used as the electrode material of the gate electrode 114 of the E-FET, the total gate resistance of the E-FET can be reduced. This can improve the characteristics of the E-FET.

Further, in the semiconductor device 100 according to the present invention, all ohmic electrodes 115c and 115d of the E-FET and the D-FET are formed simultaneously when the gate electrode 115a of the D-FET is formed. Further, the gate electrode 115b is laminated on the gate electrode 114 of the E-FET simultaneously as the gate electrode 115a and the ohmic electrodes 115c and 115d. Therefore, it is possible to prevent an increase in the process steps which may be caused by improving the capacity and realizing stable accuracy. Further, since the identical material can be used, simple and inexpensive processing can be realized.

Further, in the semiconductor device 100 according to the present invention, the ohmic electrodes 115c of the E-FET and the ohmic electrodes 115d of the D-FET are made of an electrode material having low resistance such as Ti/Al/Ti. Therefore, it is possible to reduce the source resistance and the drain resistance of the E-FET and the D-FET to thereby improve the characteristics of the E-FET and the D-FET.

The semiconductor device and the method of manufacturing thereof according to the embodiment of the present invention have been described above. However, the present invention is not limited to this embodiment.

For example, although a gate electrode having a two-layer structure is used in the E-FET in the above description, it is also acceptable to only use the gate electrode 114 made of WSiN or the like.

Further, although the gate electrode 114 is made of WSiN in the above description, the material is not limited to this, provided that it is a material having low reactivity to the material constituting the etching-stopper layer 107b (InGaP in the above example) and is capable of increasing the controllability of the threshold voltage of the E-FET. For example, the gate electrode 114 may be made of W or WSi.

Further, in the description above, the gate electrode 115a of the D-FET, the gate electrode 115b of the second layer of the E-FET, the ohmic electrodes 115c of the E-FET, and the ohmic electrodes of the D-FET are made of Ti/Al/Ti, but the material is not limited to this. Any electrode material having low resistance is acceptable. For example, the gate electrode 115a of the D-FET, the gate electrode 115b of the second layer of the E-FET, the ohmic electrodes 115c of the E-FET, and the ohmic electrodes of the D-FET may be made of Ti/Pt/Au.

Further, in the description above, the Schottky layer 108 is made of AlGaAs, but it may be made of GaAs or the like. Further, although the semiconductor substrate 101 is a GaAs substrate in the description above, it may be a compound semiconductor substrate such as an InP substrate.

INDUSTRIAL APPLICABILITY

The present invention is applicable to a semiconductor device and a manufacturing method of the same. Particularly, it is applicable to GaAsMMIC in which an E-FET and a D-FET are integrated. Further, the present invention is applicable to a communication equipment using GaAsMMIC. Particularly, it is applicable to a power amplifier, a switch and the like of a mobile telephone terminal and the like.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A semiconductor device comprising:
    a semiconductor substrate;
    a channel layer formed on said semiconductor substrate;
    a donor layer formed on said channel layer;
    a first Schottky layer formed on said donor layer;
    a second Schottky layer formed on said first Schottky layer;
    a first gate electrode formed on said first Schottky layer, said first gate electrode forming a Schottky barrier junction with said first Schottky layer;
    a first source electrode and a first drain electrode which are formed so as to sandwich said first gate electrode, and are electrically connected to said channel layer;
    a second gate electrode which is: formed on said second Schottky layer; forming a Schottky barrier junction with said second Schottky layer; and made of a material different from said first gate electrode; and
    a second source electrode and a second drain electrode which are formed so as to sandwich said second gate electrode, and are electrically connected to said channel layer.

2. The semiconductor device according to claim 1, further comprising:
    a third electrode which is formed on said first gate electrode, and made of a material same as said second gate electrode.

3. The semiconductor device according to claim 1, wherein said first source electrode, said second source electrode, said first drain electrode and said second drain electrode are made of a material same as said second gate electrode.

4. The semiconductor device according to claim 1, wherein said first gate electrode is made of one of W, WSi and WSiN.

5. The semiconductor device according to claim 1, wherein said first Schottky layer is formed in at least a single layer, and a top layer thereof is made of InGaP.

6. The semiconductor device according to claim 1, wherein said second Schottky layer is formed in at least a single layer, and a bottom layer thereof is made of one of AlGaAs and GaAs.

7. The semiconductor device according to claim 1, wherein said semiconductor substrate is made of one of GaAs and InP.

* * * * *